United States Patent
Cheng et al.

(10) Patent No.: US 7,505,109 B2
(45) Date of Patent: Mar. 17, 2009

(54) HEAT DISSIPATION STRUCTURE OF BACKLIGHT MODULE

(75) Inventors: Chi-Chen Cheng, Ershuei Township, Changhua County (TW); Ya-Ting Ho, Beigang Township, Yunlin County (TW); Meng-Chai Wu, Jhubei (TW)

(73) Assignee: AU Optronics Corporation, Hsinchu (TW)

( * ) Notice: Subject to any disclaimer, the term of this patent is extended or adjusted under 35 U.S.C. 154(b) by 414 days.

(21) Appl. No.: 11/476,484

(22) Filed: Jun. 28, 2006

(65) Prior Publication Data

US 2007/0229753 A1   Oct. 4, 2007

(30) Foreign Application Priority Data

Mar. 31, 2006   (TW) ............... 95111647 A

(51) Int. Cl.
   *G02F 1/1333*   (2006.01)
   *G02F 1/1335*   (2006.01)
(52) U.S. Cl. ............ 349/161; 362/294; 362/561; 257/98; 257/720
(58) Field of Classification Search ......... 349/161; 257/97–99, 720; 362/294, 373, 561
   See application file for complete search history.

(56) References Cited

U.S. PATENT DOCUMENTS

2004/0203189 A1* 10/2004 Chen et al. ............... 438/108
2007/0018312 A1*  1/2007 Jo .......................... 257/720
2007/0085101 A1*  4/2007 Kim ......................... 257/98
2007/0133221 A1*  6/2007 Liu ......................... 362/561
2008/0144319 A1*  6/2008 Chang et al. .............. 362/294

FOREIGN PATENT DOCUMENTS

| CN | 1622346 | 6/2005 |
| CN | 1649182 | 8/2005 |
| JP | 2002-353515 | 12/2002 |
| JP | 2003-133596 | 9/2003 |
| TW | 228960 | 1/2005 |

OTHER PUBLICATIONS

English language translation of abstract and pertinent part of CN 1649182, Aug. 3, 2005.
English language translation of abstract and pertinent part of CN 1622346, Jun. 1, 2005.

* cited by examiner

*Primary Examiner*—Hemang Sanghavi
(74) *Attorney, Agent, or Firm*—Thomas, Kayden, Horstemeyer & Risley

(57) ABSTRACT

The heat dissipation structure of the backlight module of the present invention comprises a circuit board, a heat-conductive element (such as thermally conductive glue) and a light-emitting diode (LED) chip, wherein the circuit board has an electric circuit layer and a heat conductive layer respectively formed on two opposite surfaces thereof. The circuit board has a plurality of through holes penetrating through the electric circuit layer and the heat-conductive layer of the circuit board, wherein each of the through holes is filled with heat-conductive material. The heat-conductive element is placed on the circuit layer and covers the through holes, and the LED chip is disposed on the heat-conductive element and is electrically connected to the electric circuit layer.

9 Claims, 4 Drawing Sheets

HEAT DISSIPATION STRUCTURE OF BACKLIGHT MODULE

RELATED APPLICATIONS

The present application is based on, and claims priority from, Taiwan Patent Application Serial Number 95111647, filed on Mar. 31, 2006, the disclosure of which is hereby incorporated by reference herein in its entirety.

BACKGROUND

1. Field of Invention

The present invention relates to a heat dissipation structure of a backlight module. More particularly, the present invention relates to a heat dissipation structure integrated into a circuit board of a backlight module.

2. Description of Related Art

A backlight module is one of the fundamental parts in a liquid crystal display (LCD). Since liquid crystal does not emit light itself, the backlight module is needed for providing the required light source. A backlight source commonly used in the backlight module can be a cold cathode fluorescent lamp (CCFL) and an LED (Light-Emitting Diode), etc. In comparison with the CCFL used as the backlight source, the LED has the advantages of small size, long operation life, low driving voltage, low power consumption and excellent shock resistance, etc. However, the efficiency and longevity of the LED are dependent on whether the entire backlight module has good heat-dissipation.

A conventional backlight module often adopts an aluminum substrate or fins for dissipating the heat generated by a LED used as a backlight source. However, the fins disposed on the backlight module make the backlight module too big, and especially, when the power of the LED is increasing, the sizes of the fins required therefore are also increasing. On the other hand, while being used for heat dissipation, the aluminum substrate needs to work together the heat-conductive element of which the size is much larger than that of the LED, so as to sufficiently dissipate the heat generated by the LED. Hence, the heat dissipation structure of the conventional backlight module is too big in size and cannot satisfy the requirements of the products developed towards lightness and smallness, Besides, the aluminum substrate is quite expensive and cannot be combined with a circuit board as a multi-layered substrate, thus increasing the product fabrication cost and the design difficulty level. Moreover, the conventional skill does not implement electrical isolation between the heat-dissipating and electrically conductive paths of the backlight module, thus likely causing a short circuit resulting in damage on the LCD.

SUMMARY

Hence, one aspect of the present invention is to provide a heat dissipation structure of a backlight module, thereby integrating the heat dissipation mechanism into a circuit board for achieving the objectives of small size, low cost and heat conduction.

In accordance with a preferred embodiment of the present invention, the heat dissipation structure of the backlight module comprises a circuit board, a heat-conductive element (such as thermally conductive glue) and a LED, wherein the circuit board has an electric circuit layer and a heat conductive layer, and the electric circuit layer and the heat conductive layer are formed respectively on two opposite surfaces of the circuit board. The circuit board has a plurality of through holes penetrating through the electric circuit layer and the heat-conductive layer of the circuit board, wherein each of the through holes is filled with heat-conductive material. The heat-conductive element is placed on the circuit layer and covers the through holes, and the LED chip is disposed on the heat-conductive element, and is electrically connected to the electric circuit layer.

In accordance with the other preferred embodiment of the present invention, the heat dissipation structure of the backlight module comprises a circuit board, a first heat-conductive element, a second heat-conductive element, a first LED and a second LED, wherein the circuit board has an electric circuit layer and a heat conductive layer, and the electric circuit layer and the heat conductive layer are formed respectively on two opposite surfaces of the circuit board. The circuit board has a plurality of first through holes filled with first heat-conductive material and a plurality of second through holes filled with second heat-conductive material, and the first through holes and the second through holes penetrate through the electric circuit layer and the heat-conductive layer of the circuit board, and a first isolation portion is disposed in the heat-conductive layer for electrically isolating the first through holes and the second through holes. The first heat-conductive element is placed on the circuit layer and covers the first through holes, and the second heat-conductive element is placed on the circuit layer and covers the second through holes. The first LED chip is disposed on the first heat-conductive element, and is electrically connected to the electric circuit layer. The second LED chip is disposed on the second heat-conductive element, and is electrically connected to the electric circuit layer.

The circuit board of the present invention can be such as a fiberglass printed circuit board (PCB) or a flexible printed circuit board (FPCB), and the heat conductive layer can be made of the heat-conductive material filling the through holes, and contact a housing (such as a metal housing).

Hence, the present invention provides a liquid crystal display (LCD) including the aforementioned heat dissipation structure of the backlight module. The backlight module of the present invention can be a direct-type or edge-type backlight module.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
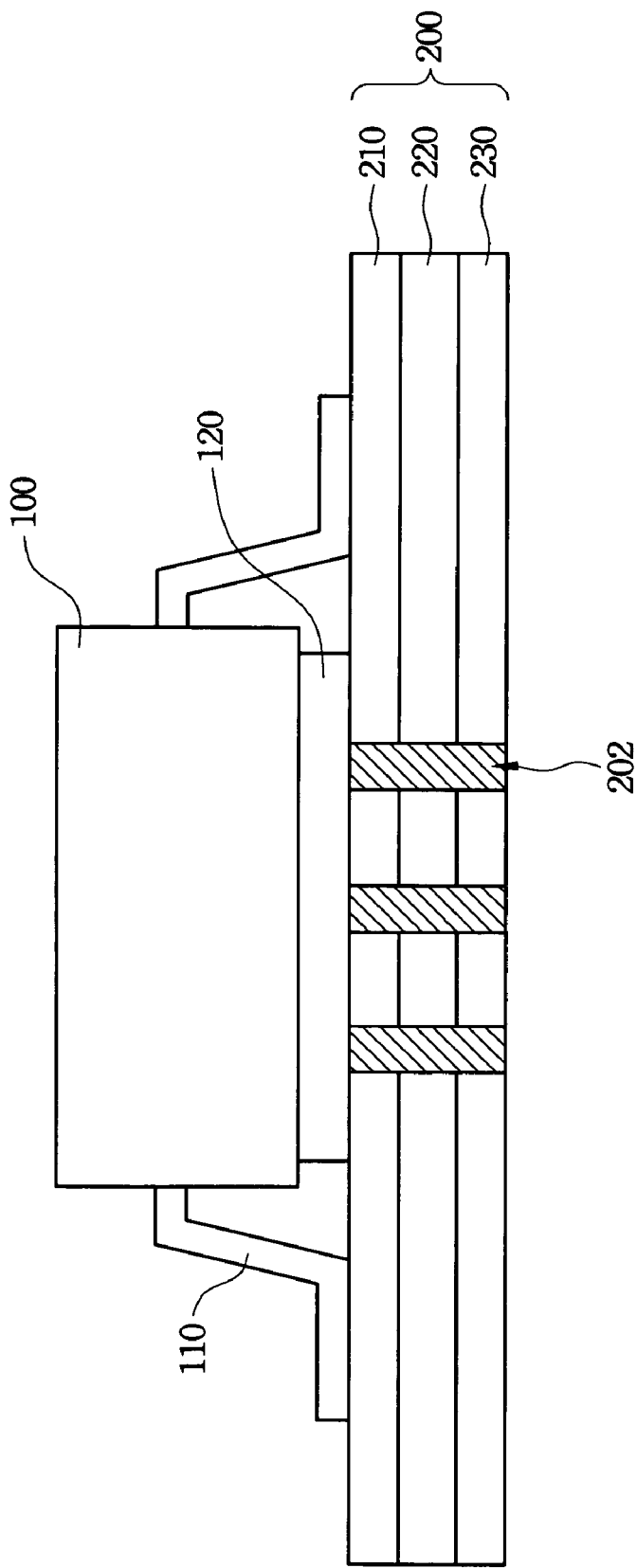
FIG. 1 is a schematic diagram showing a heat-dissipation structure of a backlight module according to a preferred embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

Referring to FIG. 1, FIG. 1 is a schematic diagram showing a heat-dissipation structure of a backlight module according to a preferred embodiment of the present invention, wherein a circuit board 200 is composed of an electric circuit layer 210, an insulation layer 220 and a heat conductive layer 230, and the electric circuit layer 210 and the heat conductive layer 230 are formed respectively on two opposite surfaces of the circuit board 200 (the insulation layer 220), i.e. the insulation layer 220 is sandwiched between the electric circuit layer 210 and the heat conductive layer 230. The present invention is mainly to implement a plurality of through holes 202 penetrating through the electric circuit layer 210, the insulation layer 220 and the heat conductive layer 230, wherein the through holes 202 are filled with heat-conductive material (not labeled). A heat-conductive element 120 is placed on the electric circuit layer 210, and covers the through holes 202. Thereafter, a LED chip 100 is disposed on the heat-conductive element 120, and is electrically connected to the circuit layer 210 by using a conductive wire (or conductive wires) 110. Hence, the heat generated by the LED chip 100 is first transmitted to the heat-conductive element 120, and then to the heat conductive layer 230 via the through holes 202 filled with the heat-conductive material, and thus to a housing (not shown) contacting the heat conductive layer 230. Since the housing is generally a heat conductor (such as a metal housing), the heat dissipation structure of the backlight module according to the present embodiment can be used to effectively transmit the heat generated by the LED chip 100 to the ambience.

On the other hand, by means of the insulation layer 220, the electrically conductive path (electrically connecting the LED chip 100 to the circuit layer via the conductive wire 110) can be isolated from the heat-dissipating path described above in the present embodiment. Further, the circuit board 200 of the present invention can be a printed circuit board, such as a fiberglass printed circuit board (PCB) or a flexible printed circuit board (FPCB). The heat-conductive element 120 can be such as thermally conductive glue used for adhering the LED chip 100 to the circuit board 200. The printed circuit board and the thermally conductive glue have the advantages of small size, low cost and easy processing, thus greatly simplifying the processing steps, lowering fabrication cost and meeting the product requirements of lightness and thinness.

Figure 2:
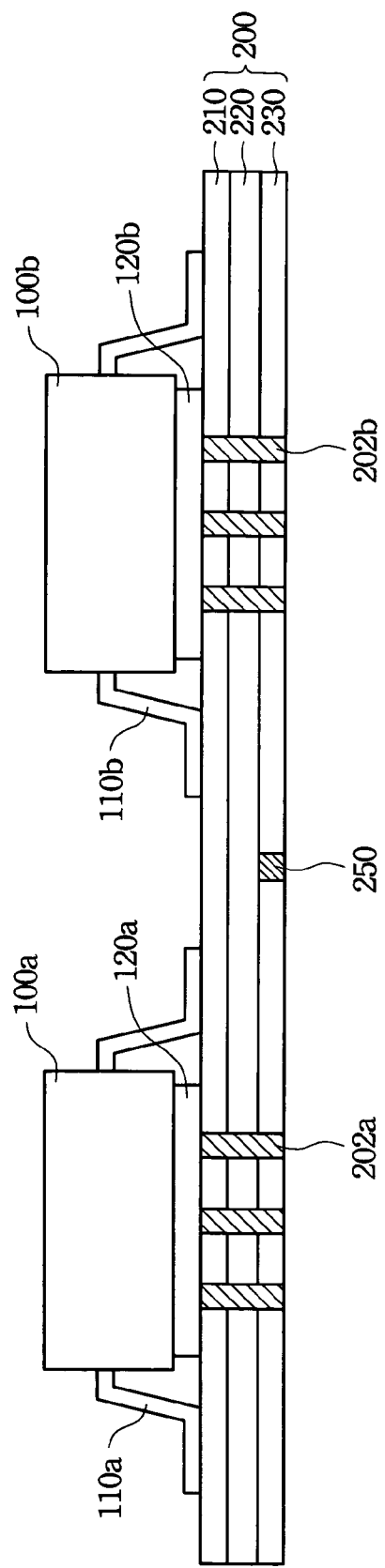
FIG. 2 is a schematic diagram showing a heat-dissipation structure of a backlight module according to the other preferred embodiment of the present invention.

Referring to FIG. 2, FIG. 2 is a schematic diagram showing a heat-dissipation structure of a backlight module according to the other preferred embodiment of the present invention, wherein two LED chips 100a and 100a are disposed. In the present embodiment, an isolation portion 250 is formed in the heat conductive layer 230 of the circuit board 200, thereby electrically isolating the heat-dissipating paths of the LED chips 100a and 100b from each other. In the present embodiment, only if the heat-conductive element 120 itself is used as one of the conductive wires 110 shown in FIG. 2, (i.e. the LED chips do not have the design of separating the heat-dissipating path and the electrically conductive path), then the isolation portion 250 is needed for isolating the wirings of the LED chips 100a from those of the LED chip 100b, meaning that one of the two conductive wires 110a (110b) can be omitted. Such as shown in FIG. 2, the circuit board 200 has a plurality of through holes 202a and 202b penetrating through the electric circuit layer 210 and the heat-conductive layer 230 of the circuit board 200. Each of the through holes 202a and each of the through holes 202b are filled with heat-conductive material, wherein the heat-conductive material filled in the through holes 202a can be the same as or different from that in the through holes 202b. The heat-conductive elements 120a and 120b are placed on the circuit layer 210 and cover the through holes 202a and 202b respectively. The LED chips 100a and 100b are disposed on the heat-conductive elements 120a and 120b, and are electrically connected to the electric circuit layer 210. The isolation portion 250 is implemented in the heat conductive layer 230 for electrically isolating the through holes 202a and the through holes 202b, thereby preventing the LED chip 100a from being short-circuited with the LED chip 100b via the through holes 202a and 202b.

The backlight modules structure described in the aforementioned preferred embodiments are included in respective liquid crystal displays (LCDs), and the LCD of the present invention may adopt a direct-type or edge-type backlight module.

Figure 3:
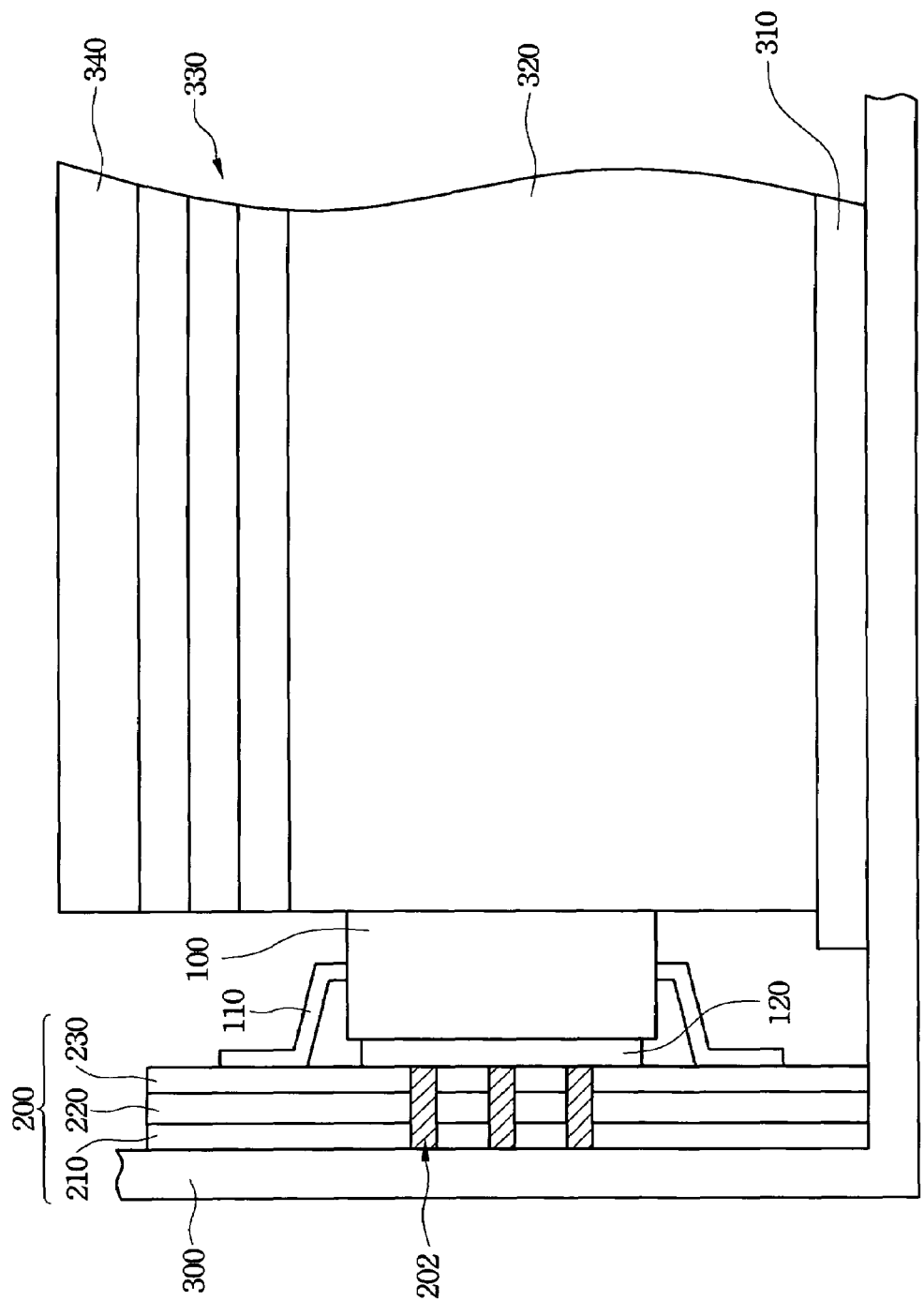
FIG. 3 is a schematic diagram showing a LCD adopting a direct-type backlight module according to the preferred embodiment of the present invention.

Referring FIG. 3, FIG. 3 is a schematic diagram showing a LCD adopting a direct-type backlight module according to the preferred embodiment of the present invention. Besides including the aforementioned backlight module, the LCD further comprises a housing 300, a reflector 310, a light guide plate 320, at least one film 330 (such as optical films) and a liquid crystal panel 340. The housing 300 is used for receiving the backlight module, wherein the heat conductive layer 230 is disposed on one side of the housing 300, and the reflector 310 is disposed on another side of the housing 300, and is adjacent to the light guide plate 320. The light guide plate 320 is disposed near the LED chip 100. The film 330 is disposed on the light guide plate 320, and the liquid crystal panel 340 is disposed on the film 330.

Figure 4:
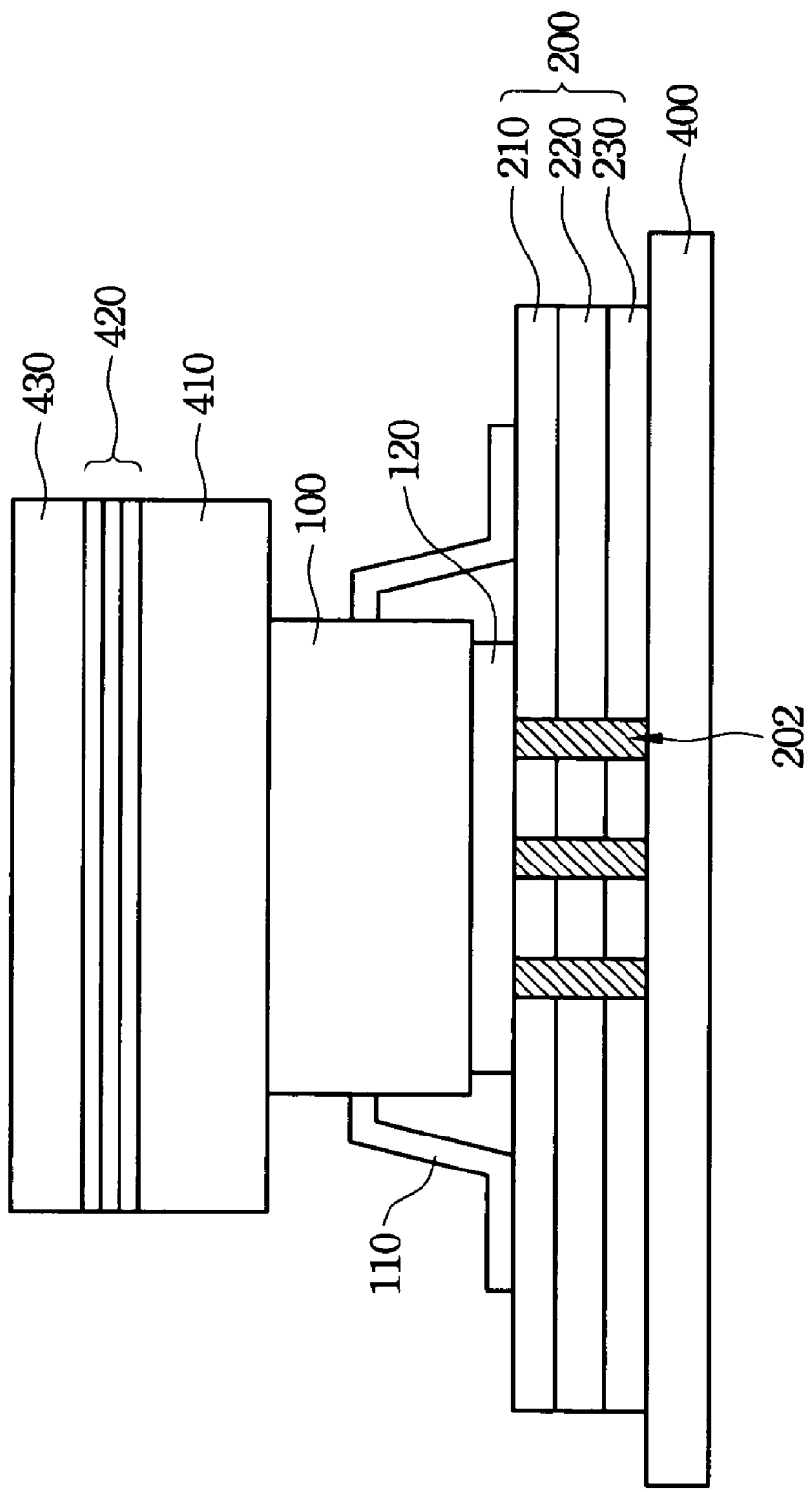
FIG. 4 is a schematic diagram showing a LCD adopting an edge-type backlight module according to the preferred embodiment of the present invention.

Referring FIG. 4, FIG. 4 is a schematic diagram showing a LCD adopting an edge-type backlight module according to the preferred embodiment of the present invention. Besides including the aforementioned backlight module, the LCD further comprises a housing 400, a diffuser 410, at least one film 420 (such as a brightness enhancement film) and a liquid crystal panel 430. The housing 400 is used for receiving the backlight module, wherein the heat conductive layer 230 is disposed on the housing 400, and the diffuser 410 is disposed above the LED chip 100. The film 420 is disposed on the diffuser 410, and the liquid crystal panel 430 is disposed on the film 420.

It can be known from the preferred embodiments of the present invention that the application of the present invention has the advantages of effectively achieving the purpose of separating the heat-dissipating path from the electrically conductive path; greatly simplifying the processing steps; lowering fabrication cost; and meeting the product requirements of lightness and thinness.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation structure of a backlight module, comprising:
   a circuit board having an electric circuit layer, a heat conductive layer respectively formed on two opposite surfaces of the circuit board, a plurality of first through holes filled with first heat-conductive material, and a plurality of second through holes filled with second heat-conductive material, wherein the first through holes and the second through holes penetrate through the electric circuit layer and the heat-conductive layer of the circuit board, respectively, and the heat conductive layer has a first isolation portion disposed therein for electrically isolating the first through holes and the second through holes;
   a first heat-conductive element disposed on the circuit layer and covering the first through holes;
   a second heat-conductive element disposed on the circuit layer and covering the second through holes;
   a first LED chip disposed on the first heat-conductive element and electrically connected to the electric circuit layer;
   a second LED chip disposed on the second heat-conductive element and electrically connected to the electric circuit layer.

2. The heat dissipation structure of claim 1, wherein at least one of the first heat-conductive element and the first heat-conductive element is thermally conductive glue.

3. The heat dissipation structure of claim 1, further comprising:
   a first conductive wire for electrically connecting the first LED chip to the electric circuit layer; and
   a second conductive wire for electrically connecting the second LED chip to the electric circuit layer.

4. The heat dissipation structure of claim 1, wherein the circuit board is a printed circuit board.

5. The heat dissipation structure of claim 1, wherein the circuit board is a flexible printed circuit.

6. A liquid crystal display, comprising:
   a backlight module, comprising:
      a circuit board having an electric circuit layer, a heat conductive layer respectively formed on two opposite surfaces of the circuit board, a plurality of first through holes filled with first heat-conductive material, and a plurality of second through holes filled with second heat-conductive material, wherein the first through holes and the second through holes penetrate through the electric circuit layer and the heat-conductive layer of the circuit board, respectively, and the heat conductive layer has a second isolation portion disposed therein for electrically isolating the first through holes and the second through holes;
      a first heat-conductive element disposed on the circuit layer and covering the first through holes; and
      a first LED chip disposed on the first heat-conductive element and electrically connected to the electric circuit layer;
   a first isolation portion disposed in the heat-conductive layer for electrically isolating the first through holes and the second through holes;
      a second heat-conductive element disposed on the circuit layer and covering the second through holes; and
      a second LED chip disposed on the second heat-conductive element and electrically connected to the electric circuit layer; and
   a housing for receiving the backlight module, wherein the heat conductive layer of the backlight module is disposed on the housing.

7. The liquid crystal display as claimed in claim 6, further comprising:
   a light guide plate disposed in the proximity of the first LED chip and the second LED chip;
   a reflector adjacent to the light guide plate;
   a film disposed on the light guide plate;
   a liquid crystal panel disposed on an optical film, wherein the heat conductive layer of the backlight module is disposed on one side of the housing.

8. The liquid crystal display as claimed in claim 6, further comprising:
   a diffuser disposed above the first LED chip and the second LED chip;
   at least one film disposed on the diffuser; and
   a liquid crystal panel disposed on an optical film.

9. The liquid crystal display as claimed in claim 6, wherein the housing is made of metal.

* * * * *